(12) United States Patent
Pfister et al.

(10) Patent No.: US 6,244,056 B1
(45) Date of Patent: *Jun. 12, 2001

(54) CONTROLLED PRODUCTION OF AMMONIA AND OTHER GASES

(75) Inventors: Dennis M. Pfister, San Luis; Charles M. Byrd, San Jose, both of CA (US)

(73) Assignee: Sun Microsystems, Inc., Palo Alto, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/385,212

(22) Filed: Aug. 27, 1999

Related U.S. Application Data

(63) Continuation-in-part of application No. 09/182,608, filed on Oct. 29, 1998, now Pat. No. 6,006,543, which is a continuation-in-part of application No. 08/811,759, filed on Mar. 6, 1997, now Pat. No. 5,855,121, which is a continuation of application No. 08/533,153, filed on Sep. 20, 1995, now abandoned.

(51) Int. Cl.$^7$ .............................. F25B 15/00; F25B 17/08
(52) U.S. Cl. .................................. 62/112; 62/480; 95/121
(58) Field of Search .............................. 62/112, 476, 480; 95/121–900; 423/299, 352; 252/69

(56) References Cited

U.S. PATENT DOCUMENTS

| 1,877,536 | 9/1932 | Ruckelshaus et al. |
| 1,881,568 | 10/1932 | Henney ................... 62/480 |
| 2,138,685 | 11/1938 | Altenkirch . |
| 2,326,130 | 8/1943 | Kleen ..................... 62/179 |
| 2,338,712 | 1/1944 | Kleen ..................... 62/480 |

(List continued on next page.)

FOREIGN PATENT DOCUMENTS

| 4 113 042 | 10/1992 | (DE) ............................ F25B/30/04 |
| 0 037 643 A1 | 10/1981 | (EP) . |
| 0 091 382 A1 | 10/1983 | (EP) . |
| 2 604 100 A1 | 3/1988 | (FR) . |
| 2 651 621 A1 | 3/1991 | (FR) . |
| 2 666 141 | 2/1992 | (FR) ............................ F25B/27/00 |
| 2 689 220 A1 | 10/1993 | (FR) . |
| 2 703 763 A1 | 10/1994 | (FR) . |
| 2 736 421 A1 | 1/1997 | (FR) . |
| 2 604 100 A1 | 12/1998 | (FR) . |
| WO 97/11323 | 3/1997 | (WO) . |

OTHER PUBLICATIONS

Buffington, R.M., *Absorption Refrigeration with Solid Absorbents*, Sep. 1993, 7 pages, Electrolux Servel Laboratories, New York, N.Y.

(List continued on next page.)

*Primary Examiner*—William Doerrler
(74) *Attorney, Agent, or Firm*—Conley, Rose & Tayon, PC; Eric B. Meyertons

(57) ABSTRACT

Improved methods for the controlled generation of ammonia from an ammoniated metal salt at substantially ambient temperature by applying microwave energy to the salt. The ammoniated salts have the formula $MA_n \cdot X(NH_3)$, wherein M is at least one metal selected from the group consisting of alkali metals, alkaline earth metals, scandium, ytterbium, the lanthanides, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, mercury, tin, and aluminum; A is at least one ion selected from the group consisting of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and $SbF_6^-$ n is from 1 to 6; and X is from 1 to 8. The methods are useful in, inter alia, absorption type refrigeration systems where ammonia is used as a refrigerant and the salt is used as a sorbent bed.

33 Claims, 2 Drawing Sheets

U.S. PATENT DOCUMENTS

| | | | |
|---|---|---|---|
| 2,384,460 | 9/1945 | Kleen | 62/118 |
| 2,496,459 | 2/1950 | Kleen | 62/5 |
| 2,624,182 | 1/1953 | Gross | 62/118 |
| 4,312,640 | 1/1982 | Verrando | 55/33 |
| 4,312,641 | 1/1982 | Verrando et al. . | |
| 4,399,341 | 8/1983 | Yasuoka . | |
| 4,571,473 | 2/1986 | Wyslouzil et al. . | |
| 4,581,049 | 4/1986 | Januschkowetz | 62/480 |
| 4,742,868 | 5/1988 | Mitani et al. | 165/104.12 |
| 4,884,626 | 12/1989 | Filipowski . | |
| 4,889,965 | 12/1989 | Gervais et al. . | |
| 4,928,207 | 5/1990 | Chrysler et al. . | |
| 4,944,159 | 7/1990 | Crozat | 62/112 |
| 4,976,117 | 12/1990 | Crozat et al. | 62/480 |
| 5,021,620 | 6/1991 | Inumada . | |
| 5,025,635 | 6/1991 | Rockenfeller et al. | 62/106 |
| 5,027,607 | 7/1991 | Rockenfeller et al. | 62/106 |
| 5,088,302 | 2/1992 | Tomizawa et al. . | |
| 5,161,389 | 11/1992 | Rockenfeller et al. | 62/480 |
| 5,165,247 | 11/1992 | Rockenfeller et al. | 62/77 |
| 5,179,259 | 1/1993 | Martin | 219/10.55 A |
| 5,216,327 | 6/1993 | Myers et al. . | |
| 5,220,804 | 6/1993 | Tilton et al. . | |
| 5,222,543 | 6/1993 | Carlstrom et al. . | |
| 5,223,809 | 6/1993 | Myer . | |
| 5,227,598 | 7/1993 | Woodmansee et al. . | |
| 5,271,239 | 12/1993 | Rockenfeller et al. | 62/259.2 |
| 5,274,347 | 12/1993 | Bobadilla . | |
| 5,291,942 | 3/1994 | Ryan | 62/480 |
| 5,300,901 | 4/1994 | Krümmel et al. . | |
| 5,333,471 | 8/1994 | Yamada | 62/476 |
| 5,384,101 * | 1/1995 | Rockenfeller | 422/211 |
| 5,442,931 | 8/1995 | Ryan et al. | 62/101 |
| 5,490,398 * | 2/1996 | Cline | 62/497 |
| 5,522,452 | 6/1996 | Mizuno et al. . | |
| 5,664,427 * | 9/1997 | Rockenfeller et al. | 62/112 |
| 5,855,121 * | 1/1999 | Byrd et al. | 62/497 |

OTHER PUBLICATIONS

Vasiliev, L. et al., *Waste Heat Driven Solid Sorption Coolers*, Date Unknown, 9 pages.

Iloeje, O.C., *Design Construction and Test Run of a Solar Powered Slid Absorption Refrigerator*, Sep. 6, 1984, pp. 447–455, Pergamon Press Ltd., U.S.A.

International Search Report for PCT/US98/05460 dated Mar. 20, 1998.

International Search Report for PCT/US98/05466 dated Mar. 20, 1998.

International Search Report for PCT/US98/05691 dated Mar. 20, 1998.

* cited by examiner

CONTROLLED PRODUCTION OF AMMONIA AND OTHER GASES

This is a continuation-in-part of U.S. patent application Ser. No. 09/182,608 filed on Oct. 29, 1998 is now U.S. Pat. No. 6,006,543, which is a continuation of U.S. patent application Ser. No. 08/811,759 filed on Mar. 6, 1997 (now U.S. Pat. No. 5,855,121,) which is a continuation of U.S. patent application Ser. No. 08/533,153 filed on Sep. 20, 1995, now abandoned.

BACKGROUND OF THE INVENTION

This invention relates to methods for the controlled generation of ammonia or other gases from an ammoniated metal salt or the like at substantially ambient temperature by applying microwave energy to the salt. The methods are useful in, inter alia, adsorption type refrigeration systems where ammonia is used as a refrigerant and the salt is used as a sorbent bed.

Adsorption type refrigeration systems are described generally in Perry's Chemical Engineers' Handbook, Sixth Edition (R. H. Perry, D. W. Green, and J. O. Maloney, eds., McGraw-Hill, 1984). The chemical components of such a system are comprised of (1) a sorbate which functions as a refrigerant and is normally a gas at room temperature and atmospheric pressure, (2) a solid or liquid sorbent onto which the sorbate adsorbs, and (3) the sorbate:sorbent complex. The cooling effect in these systems is achieved by operation of an adsorption/desorption cycle whereby the sorbate is alternatingly adsorbed onto and desorbed from the sorbent. The desorption step is performed on the sorbate::sorbent complex causing the sorbate to be separated from the complex as a gas. Desorption also regenerates the sorbent thereby allowing the cycle to be repeated. The separated gas may be transferred to a condenser and, once condensed, then transferred to an evaporator where vaporization will occur with the desired, concomitant cooling of the surrounding atmosphere.

In a conventional refrigeration system, desorption is achieved by heating the sorbate:sorbent complex. The amount of heat required will depend on properties of the complex such as its specific heat and the energy of association between sorbate and sorbent. The greater the heat required to effect desorption, the lower will be the efficiency R of the refrigeration system, which is a ratio of the useful refrigerating effect divided by the heat input required during the refrigeration cycle:

$$R = \frac{\text{useful refrigerating effect, Btu/h}}{\text{heat input, Btu/h}}$$

It is thus a disadvantage for refrigeration systems to require high heat input for desorption. Another disadvantage of heating the sorbate:sorbent complex desorption is that the regenerated sorbent must first be cooled before the sorption cycle is repeated. Substantial cooling of the sorbent is needed because adsorption occurs much more effectively at temperatures well below those required for desorption. Since both the heating of the complex and cooling of the resulting regenerated sorbent expend significant energy and time, it would be desirable to develop new systems in which the desorption step can be effected in a shorter time and with less energy.

U.S. Pat. No. 4,848,994 describes a refrigeration system which uses ammoniated complex compounds. In this system, the refrigerant sorbate is ammonia and the sorbent is a metal salt which is capable of forming an ammoniated complex. Included among the disclosed salts are metal chlorides or bromides in which the metal is an alkaline earth metal, chromium, manganese, iron, cobalt, nickel, cadmium, tantalum or rhenium. In the ammoniated complex, the number of ammonia molecules that are complexed with the salt may vary from two to eight per molecule of salt depending on the salt. Desorption of the ammonia is reported to be effected by heating the complex.

Heat induced desorption of ammonia from ammoniated salts has also been described by R. M. Buffington in *Refrigeration Engineering* 26, 137 (1933).

U.S. Pat. No. 4,312,640 describes the desorption of polar gases from a desiccant or sorbent using microwave energy. Unlike the adsorbed polar gas, the sorbent material is transparent to microwave energy so that desorption may occur without appreciable heating of the sorbent. Examples of sorbents that are described as microwave transparent include silica gel, Mobil Sorbeads, magnesium sulfate, calcium sulfate and natural and synthetic zeolites. It is stated that useful sorbents are those having strongly bound water of hydration, such as molecular sieves or alumina. The patent states that the water of hydration is not removed from the sorbent in the desorption process it describes.

U.S. Pat. No. 5,227,598 describes a system for regenerating adsorbent material. The patent discloses the use of microwave heating of adsorbents to a temperature sufficient to desorb the sorbates from the adsorbent.

SUMMARY OF THE INVENTION

It has now been found that ammonia may be generated from certain ammoniated salts at approximately ambient temperature by applying microwave energy to such ammoniated salts which are microwave transparent. The salts are metal salts having the formula $MA_n \cdot X(NH_3)$; wherein M is at least one metal selected from the group consisting of alkali metals, alkaline earth metals, scandium, ytterbium, the lanthanides, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, mercury, and aluminum; A is at least one ion selected from the group consisting of Cl, Br, F, I, $ClO_3$, $ClO_4$, $BF_4$, $AlCl_4$, $PF_6$, $SbCl_6$, and $SbF_6$; n is from 1 to 6; and X is from 1 to 8. Preferably, the salt is an alkali metal halide, an alkaline earth metal halide, or more preferably, a strontium halide.

Ammonia is generated by applying microwave energy to a metal salt having the formula described herein at substantially ambient temperature for a time sufficient to produce the ammonia. Using microwave energy to separate ammonia from a metal salt at ambient temperature is particularly useful in refrigeration systems where application of heat is undesirable. Ammonia alternately adsorbs and desorbs from the metal salt, the desorption step being accomplished by applying microwave energy to the metal salt at substantially ambient temperature. The desorbed ammonia is circulated through a refrigeration sorption system to produce a cooling effect.

DETAILED DESCRIPTION OF THE INVENTION

Figure 1:
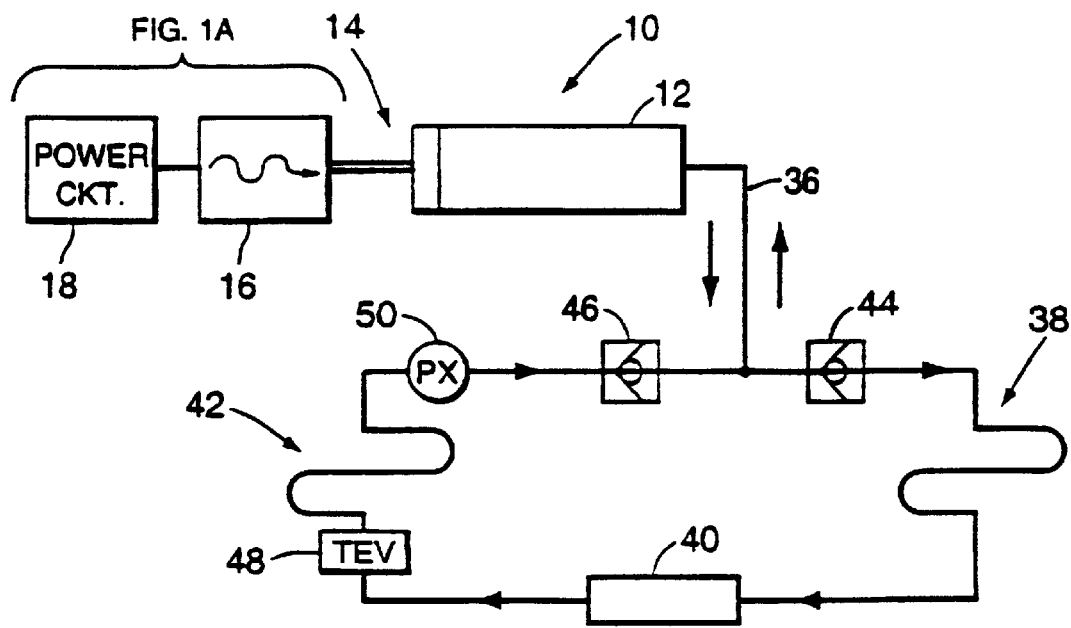
FIG. 1 is a schematic representation of an exemplary refrigeration sorption system of this invention.

This invention relates to a method for generating ammonia from an ammoniated metal salt by applying microwave energy to the salt at substantially ambient temperature for a time sufficient to produce ammonia. The ammoniated metal salt has the formula $MA_n \cdot X(NH_3)$; wherein M is at least one metal selected from the group consisting of alkali metals, alkaline earth metals, scandium, ytterbium, the lanthanides, titanium, zirconium, hafnium, vanadium, niobiurn, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, mercury, tin, and aluminum; A is at least one ion selected from the group consisting of Cl, Br, F, I, $ClO_3$, $ClO_4$, $BF_4$, $AlCl_4$, $PF_6$, $SbCl_6$, and $SbF_6$ n is from 1 to 6; and X is from 1 to 8. "Y" represents the number of ammonia molecules per salt molecule.

The ammonia may be generated from metal salts that are either partially or fully ammoniated. For a fully ammoniated salt the value of X is typically in the range of one to eight.

As used herein, the term adsorption means the taking up of a substance (also referred to as a sorbate) by a material (also referred to as a sorbent) that has a substantially large capacity for adsorbing the substance. The term desorption means the release of the adsorbed substance from the sorbent. As used herein, the terms "generation," "separation," and "desorption" may be used interchangeably.

Accordingly, as applied to one aspect of this invention, the term "adsorption" refers to the taking up of ammonia (i.e., the sorbate) by a metal salt (i.e., the sorbent) thereby providing a corresponding ammoniated salt (also referred to as a sorbate/sorbent complex) having a larger X value. The term "desorption" refers to the separation of $NH_3$ from an ammoniated metal salt thereby providing a salt having a smaller X value.

Examples of metal salts suitable for ammoniation include halides of at least one of copper, silver, gold, chromium, manganese, iron, cobalt, nickel, palladium, platinum, copper, zinc, cadmium, mercury, scandium, ytterbium, the lanthanides, chromium, molybdenum, tungsten, technetium, rhenium, iron, ruthenium, osmium, cobalt, rhodium, and iridium. Additional metal salts suitable for ammoniation include salts comprising at least one metal selected from titanium, zirconium, hafnium, vanadium, niobium, molybdenum, tungsten, tantalum, and osmium, and at least one ion selected from Cl, Br, F, I, $ClO_3$, $ClO_4$, $BF_4$, $AlCl_4$, $PF_6$, $SbCl_6$, and $SbF_6$.

Preferred ammoniated metal salts include alkali metal (i.e., Group IA) halides, especially chlorides or bromides. Also preferred are alkaline earth metal (i.e., Group IIA) halides, especially chlorides or bromides. Examples of alkali and alkaline earth metal halides are halides of lithium, sodium, potassium, rubidium, cesium, beryllium, magnesium, calcium, strontium and barium. Among these salts, a yet more preferred salt is strontium chloride or strontium bromide.

Also preferred are metal chlorides or bromides in which the metal is chromium, manganese, iron, cobalt, nickel, cadmium, zinc, tantalum or rhenium. Also preferred are mixed metal chlorides selected from $NaAlCl_4$, $KAlCl_4$, $K_2ZnCl_4$, $K_2FeCl_5$, $CsCuCl_3$.

Suitable metal salts may further comprise ammonium ions, including, for example, $NH_4AlCl_4$, $(NH_4)_2ZnCl_4$, $(NH_4)_3ZnCl_5$, and $NH_4Cl$.

The ammoniated salt may be prepared from the corresponding hydrated salt as follows. The hydrated salt is placed in a vessel and, under reduced pressure, subjected to microwave energy at a frequency of about 2.54 GHertz to remove the water of hydration. After evacuation, the resulting anhydride salt is exposed to ammonia by blanketing the anhydride salt with an ammonia atmosphere to form the ammoniated salt.

Representative ammoniated salts are listed in Table 1.

TABLE 1

Representative Ammoniated Salts

| Salt | Value of X | Salt | Value of X |
|---|---|---|---|
| $ReCl_2 \cdot X(NH_3)$ | 2–4 | $NiCl_2 \cdot X(NH_3)$ | 2–6 |
| $MgCl_2 \cdot X(NH_3)$ | 2–6 | $NiBr2 \cdot X(NH_3)$ | 2–6 |
| $MgBr_2 \cdot X(NH_3)$ | 2–6 | $Ni(ClO_3)_2 \cdot X(NH_3)$ | 0–6 |
| $Mg(ClO_4)_2 \cdot X(NH_3)$ | 0–6 | $CrCl_2 \cdot X(NH_3)$ | 0–3,3–6 |
| $CaCl_2 \cdot X(NH_3)$ | 2–4 | $CdBr_2 \cdot X(NH_3)$ | 2–6 |
| $CaCl_2 \cdot X(NH_3)$ | 4–8 | $TaCl_5 \cdot X(NH_3)$ | 0–7 |
| $CaBr2 \cdot X(NH_3)$ | 2–6 | $ReCl_3 \cdot X(NH_3)$ | 0–6 |
| $Ca(ClO_4)_2 \cdot X(NH_3)$ | 2–6 | $ReBr_3 \cdot X(NH_3)$ | 0–7 |
| $SrCl_2 \cdot X(NH_3)$ | 1–8 | $SnCl_2 \cdot X(NH_3)$ | 0–2.5 |
| $SrBr2 \cdot X(NH_3)$ | 2–8 | $NH_4AlCl_4 \cdot X(NH_3)$ | 0–6 |
| $Sr(ClO_4)_2 \cdot X(NH_3)$ | 0–6 | $NaAlCl_4 \cdot X(NH_3)$ | 0–6 |
| $BaBr_2 \cdot X(NH_3)$ | 4–8 | $KAlCl_4 \cdot X(NH_3)$ | 0–6 |
| $BaCl_2 \cdot X(NH_3)$ | 0–8 | $(NH_4)_2ZnCl_4 \cdot X(NH_3)$ | 0–4 |
| $MnCl_2 \cdot X(NH_3)$ | 2–6 | $(NH_4)_3ZnCl_5 \cdot X(NH_3)$ | 0–6 |
| $MnBr_2 \cdot X(NH_3)$ | 2–6 | $K_2ZnCl_4 \cdot X(NH_3)$ | 0–5 |
| $FeCl_2 \cdot X(NH_3)$ | 2–6 | $K_2ZnCl_4 \cdot X(NH_3)$ | 5–12 |
| $FeBr_2 \cdot X(NH_3)$ | 2–6 | $CsCuCl_3 \cdot X(NH_3)$ | 2–5 |
| $COCl_2 \cdot X(NH_3)$ | 2–6 | $K_2FeCl_5 \cdot X(NH_3)$ | 2–5 |
| $CoBr_2 \cdot X(NH_3)$ | 2–6 | $NH_4Cl \cdot X(NH_3)$ | 0–3 |
| $NaBr \cdot X(NH_3)$ | 0–5.25 | | |

The microwave energy useful in the present system is in the frequency range of about 0.03 to about 1000 gigaHertz, preferably in the range of about 1 to 110 GHertz. Such microwave generators are commercially available and may employ amplitron magnetron, microton, klystron tubes, or solid state microwave generating devices. Selecting the size and capacity requirements of the microwave generator will be based on the amount of ammoniated salt that will be exposed to the microwaves, the nature of the salt, and the desired exposure time.

In general, polar or ionizable substances absorb microwaves whereas non-polar, non-ionizable substances do not. It is a feature of the system that upon exposure of the ammoniated salt, the ammonia molecules selectively absorb the energy whereas the metal salt molecules either do not absorb the microwaves, i.e., are microwave transparent, or absorb them to a much lesser extent. Since the metal salt component of the ammoniated salt does not absorb the microwave energy, separation of the ammonia may be achieved without an appreciable rise in the temperature of the salt. During the desorption of ammonia, the temperature of the salt either does not rise or rises no more than a few degrees centigrade. As used herein, "ambient temperature" means the temperature of the salt before the microwave energy is applied to the salt.

In subjecting the ammoniated salt to microwave energy, not all of the ammonia molecules need be desorbed. Those molecules that do separate are released as gas when desorption is performed at room temperature and atmospheric pressure. While it has been determined that at least some of the ammonia is separated from the ammoniated salt during desorption, the precise stoichiometry of the microwave-induced separation has not been determined. However, it is believed that microwave desorption produces at least the number of moles of ammonia per mole of ammoniated salt as conventional heat induced desorption. The stoichiometries of some analogous heat-induced desorption reactions, which provide free ammonia, are shown in Table 2.

TABLE 2

Heat Induced Reactions

| | |
|---|---|
| $MgCl_2 \cdot 6NH_{3(s)}$ | $MgCl_2 \cdot 2NH_{3(s)} + 4NH_3(g)$ |
| $CaCl_2 \cdot 8NH_{3(s)}$ | $CaCl_2 \cdot 2NH_{3(s)} + 6NH_3(g)$ |
| $SrBr_2 \cdot 8NH_{3(s)}$ | $SrBr_2 \cdot 2NH_{3(s)} + 6NH_3(g)$ |
| $MgCl_2 \cdot 4H2O_{(s)}$ | $MgCl_2 + 2H2O(g) \cdot 2H2O_{(s)}$ |
| $CaCl_2 \cdot 6CH_3NH_{2(s)}$ | $CaCl_2 \cdot 2CH_3NH_{2(s)} + 4CH_3NH_{2(g)}$ |

Similar stoichiometry is expected for the microwave-induced desorption of these salts in accordance with the present method.

Like the heat-induced desorption reactions, the microwave reactions are generally reversible and are therefore suitable for refrigeration and other systems that can employ cyclic adsorption/desorption cycles described above. One significant difference is that the microwave-induced separation can occur without an undesired increase in salt temperature. Without the high heat input that is required in conventional heat-induced desorption, the microwave-induced desorption provides the potential for greater machine efficiency in refrigeration systems.

One embodiment therefore relates to methods of cooling which comprise separation of ammonia from an ammoniated salt by applying microwave energy to the salt. The salt may be one of the salts described above or a blend of salts. Preferred salts are alkali metal or alkaline earth metal halides, preferably alkali metal or alkaline earth metal chlorides or bromides, even more preferably strontium halide. Also preferred are metal chlorides or bromides in which the metal is chromium, manganese, iron, cobalt, nickel, cadmium, zinc, tantalum, or rhenium. Also preferred are mixed metal chlorides selected from $NaAlCl_4$, $KAlCl_4$, $K_2ZnCl_4$, $K_2FeCl_5$, and $CsCuCl_3$. These ammoniated salts are solids generally containing a substantial concentration of atoms capable of forming bonds with ammonia. These salts also are substantially transparent to microwave energy and are substantially microporous or permeable to ammonia.

It has also been found that zeolites and molecular sieves may be used in place of metal salts in this method. Natural and synthetic zeolites will adsorb ammonia, and the ammonia subsequently may be desorbed by treating the ammonia:zeolite complex with microwave energy. Such desorption occurs with little or no rise in zeolite temperature. The microwave induced ammonia desorption from zeolites may be used as a step in a refrigeration process. Therefore, another embodiment relates to a method of cooling comprising the steps of (a) adsorbing gaseous ammonia onto a zeolite to provide a corresponding ammoniated zeolite, (b) desorbing the ammonia from the ammoniated zeolite by applying microwave energy to the ammoniated zeolite; and (c) circulating the desorbed ammonia through a refrigeration sorption system to produce a cooling effect. The zeolites may be used in refrigeration sorption systems of the type described herein. Preferred zeolites have substantially high cation exchange capacity and porosity.

Another embodiment relates to methods for generating hazardous gases, other than ammonia, from a solid sorbent by applying microwave energy to the sorbate:sorbent complex at ambient temperature. For example, the embodiments of the present method may be useful for generating or recycling phosphine (also referred to as hydrogen phosphide) or arsine (also referred to as arsenic hydride) and the like.

For example, phosphine or arsine may be separated from certain metal salts by applying microwave energy to the salt at substantially ambient temperature for a time sufficient to produce phosphine or arsine. The ligated salts to be used are analogous to the ammoniated salts described above for ammonia generation, and are represented by the formula $MA_n \cdot X(EH_3)$, where E is P or As.

Therefore, a further embodiment relates to a method for generating phosphine or arsine from a metal salt having the formula $MA_n \cdot X(EH_3)$ by applying microwave energy to the salt at ambient temperature, wherein M is at least one of alkali metals, alkaline earth metals, scandium, ytterbium, the lanthanides, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, mercury, tin, and aluminum, A is at least one ion selected from the group consisting of Cl, Br, F, I, $ClO_3$, $ClO_4$, $BF_4$, $AlCl_4$, PFl, $SbCl_6$, and $SbF_6$; n is from 1 to 6; X is from 1 to 8; and E is P or As. Preferably, $MA_n$ is an alkali metal or an alkaline earth metal chloride or bromide, a metal chloride or bromide in which the metal is chromium, manganese, iron, cobalt, nickel, cadmium, zinc, tantalum or rhenium, or a mixed metal chloride selected from $NaAlCl_4$, $KAlCl_4$, $K_2ZnCl_4$, $K_2FeCl_5$, $CsCuCl_3$ and the value of X is one to eight. Since phosphine and arsine are toxic and heat sensitive, it is advantageous to recycle these materials at room temperature using the present method.

Yet another embodiment relates to methods of cooling which comprise the desorption step discussed above and a prior step of contacting a metal salt with gaseous ammonia to provide a corresponding ammoniated metal salt having the formula $MA_n \cdot X(NH_3)$. These ammoniated metal salts, of course, are the ones described hereinbefore. The "base" or non-ammoniated metal salts are apparent from the formulas of the ammoniated metal salts previously described.

An example of a refrigeration sorption system according to present system is depicted in FIG. 1. The system is shown to comprise a waveguide applicator 10 and a sorber 12 which houses the salt or sorbent and in which the adsorption/desorption reactions will take place. In a preferred embodiment, the sorbent is a strontium bromide and ammonia is used as the refrigerant.

The waveguide applicator 10 includes a waveguide coupler 14 for coupling the sorber 12 to a magnetron 16 or any other suitable means for generating microwaves in the frequency band of interest. Magnetron 16 is powered by a power circuit 18 which preferably includes, with reference to FIG. 1A, an alternating current power source 20 connected to a solid state switch 22 which feeds a transformer 24 which in turn drives the magnetron 16. The power circuit 18 also includes a programmable microcontroller 26, such as the Motorola MC68HCO5 microcontroller, for controlling the operation of the switch 22. The microcontroller 26 includes a clock 28 and an associated memory device (not shown) for storing program operating instructions.

Figure 1A:
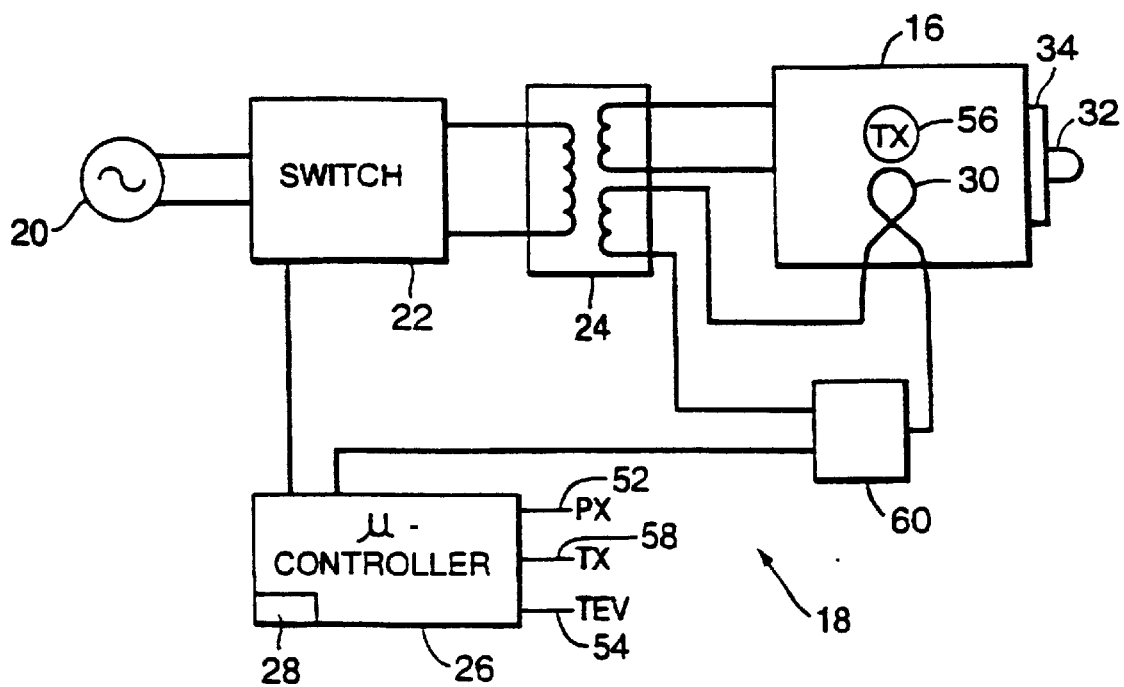
FIG. 1A is a schematic diagram of the power supply and microwave generator of the sorption system depicted in FIG. 1.

The selection of the magnetron 16 depends upon the power requirements of the particular system in which the waveguide applicator 10 is used and the desired operating frequency of the system. For the exemplary refrigeration sorption system depicted in FIG. 1, a suitable magnetron 16 is the Samsung 900 Watt cold cathode magnetron, which has an output frequency of 2.54 GHz. The representative magnetron 16 depicted in FIG. 1A is shown to comprise a cathode 30, an antenna 32 and an outer conductor 34. The structural details of the magnetron 16 are well understood by those skilled in the art. Any other electromagnetic wave generator may be used in conjunction with waveguide applicator 10, such as a klystron, a traveling wave tube or any solid state device that is capable of providing a desired level of power at the required frequency. The textbook *Practical RF Power Design Techniques* by Irving M. Gottlieb (TAB Books, 1993) is a useful reference for configuring the microwave components of the present system. Referring again to FIG. 1, the exemplary refrigeration sorption system is a closed loop system which comprises an input/output line or conduit 36 communicating with the interior of the sorber 12, a condenser 38 connected to the input/output line 36, a receiver or refrigerant reservoir 40 in communication with the output of the condenser 38, and an evaporator 42 connected between the receiver 40 and the input/output line 36. Suitable check valves 44, 46 are provided between the input/output line 36 and the condenser 38 and evaporator 42, respectively, to control the flow of the sorbate through the system and into and out of the sorber 12. It should be understood that separate lines could be provided to connect the sorber 12 respectively with the condenser 38 and the evaporator 42.

The design of the condenser 38 is dependent upon the volume of the sorbate employed in the system, which in turn depends upon the temperature drop desired at the evaporator 42 and the specific sorbate and sorbent employed in the system, as will be described hereafter by way of example. For ammonia as the refrigerant or sorbate, the volume of the condenser 38 is preferably sufficiently large to maintain the liquid ammonia at a pressure between approximately 130 psi and 140 psi, which results in a condenser temperature of around 30° to 50° C. The condenser 38 may be provided with cooling fins or other means to dissipate the heat of condensation from the sorbate during the time required for the desorb cycle. Since the present system does not result in thermal energy being transferred to the sorbate during the desorption reaction, a smaller condenser may be used than is typically required in sorption systems. In addition, depending on the system, the condenser 38 may be dispensed with and the sorbate vented directly into the receiver 40, or, if the volume of the conduit between the check valve 44 and the evaporator 42 is sufficiently large, both the condenser 38 and the receiver 40 may be omitted.

The evaporator 42 is designed using conventional refrigeration techniques to have the capacity and configuration required to achieve a desired cooling effect. A flow control valve, for example a TEV 48, is preferably provided upstream of the evaporator 42 to selectively discharge the liquid sorbate into the evaporator 42. The TEV 48 is a conventional electrically-controlled, solenoid-actuated valve. The particular TEV selected should have a capacity large enough to accommodate the mass flow rate of the sorbate in the system. In accordance with the exemplary refrigeration sorption system described herein, the operation of the TEV 48 is dependent on the pressure in the evaporator 42, which is measured by a suitable pressure sensor 50 which is preferably located at the output of the evaporator 42. The pressure sensor 50 transmits a signal indicative of the evaporator pressure to the microcontroller 26 over a lead 52, and the microcontroller 26 controls the operation of the TEV via appropriate signals communicated over a lead 54. In order to prevent the sorbate from evaporating inside the TEV 48, a capillary tube is inserted into the outlet of the TEV 48 and extends into the evaporator 42 to a point where the load to be cooled is expected to be concentrated. The diameter of the capillary tube is typically selected to be between about 0.004 to 0.030 inch, depending on the mass flow rate of the sorbate. Any other suitable flow control valve, for example a thermal expansion valve, may be used in place of the TEV 48.

It is preferred that the fully ammoniated salt, such as $SrBr_2$—$SNH_{3(s)}$, having no extraneous water, be placed in the sorber 12. Such water may cause arcing in a coaxial applicator 10 which is not designed to use water as the sorbate. The removal of the moisture may be accomplished by subjecting the sorbent, such as $SrBr_{2(s)}$, to microwaves under a vacuum. Then, in a moisture-free enclosure, a predetermined amount of sorbent is treated with a predetermined amount of sorbate, which amounts depend on the requirements of the system, as will be explained hereafter by way of example. The dry, fully ammoniated salt is preferably packed into the sorber 12 to a pressure of about 50 psi to ensure that the salt makes good contact with the surrounding structural elements.

During the desorb cycle, microwaves from the magnetron 16 are propagated through the salt by waveguide applicator 10 to desorb the sorbate from the salt. The free sorbate gas expands isothermally past check valve 44 into the condenser 38, where it condenses to a relatively high pressure liquid state. The liquid sorbate is then communicated into the receiver 40, where it is held by the TEV 48 until a cooling cycle is to begin.

After the desorption reaction has been completed, the system is immediately ready to commence an adsorb cycle. Since the microwaves do not heat the sorbent during the desorption reaction, the sorbent does not need to be cooled prior to commencing the adsorption reaction. Therefore, an adsorption reaction may begin immediately following a desorption reaction in the sorption cycle.

During the adsorb cycle, which corresponds with the cooling cycle in the embodiment of the refrigeration sorption system depicted in FIG. 1, liquid sorbate is released by the TEV 48 into the evaporator 42. The sorbate evaporates to produce a cooling effect and, due to the pressure gradient between evaporator 42 and sorber 12, the evaporated sorbate is drawn through the check valve 46 and the line 36 into the sorber 12. The sorbate combines with the sorbent in a chemical reaction as discussed above. This chemical reaction generates a heat of adsorption, which heat must ideally be dissipated before the next adsorb cycle may begin. Accordingly, the waveguide applicator 10 may be provided with cooling means (not shown) to dissipate the heat of adsorption during the adsorb and desorb cycles. Consequently, the sorption cycle may proceed repeatedly from the desorb cycle to the adsorb cycle without requiring a sorbent cooling cycle in between.

Figure 2:
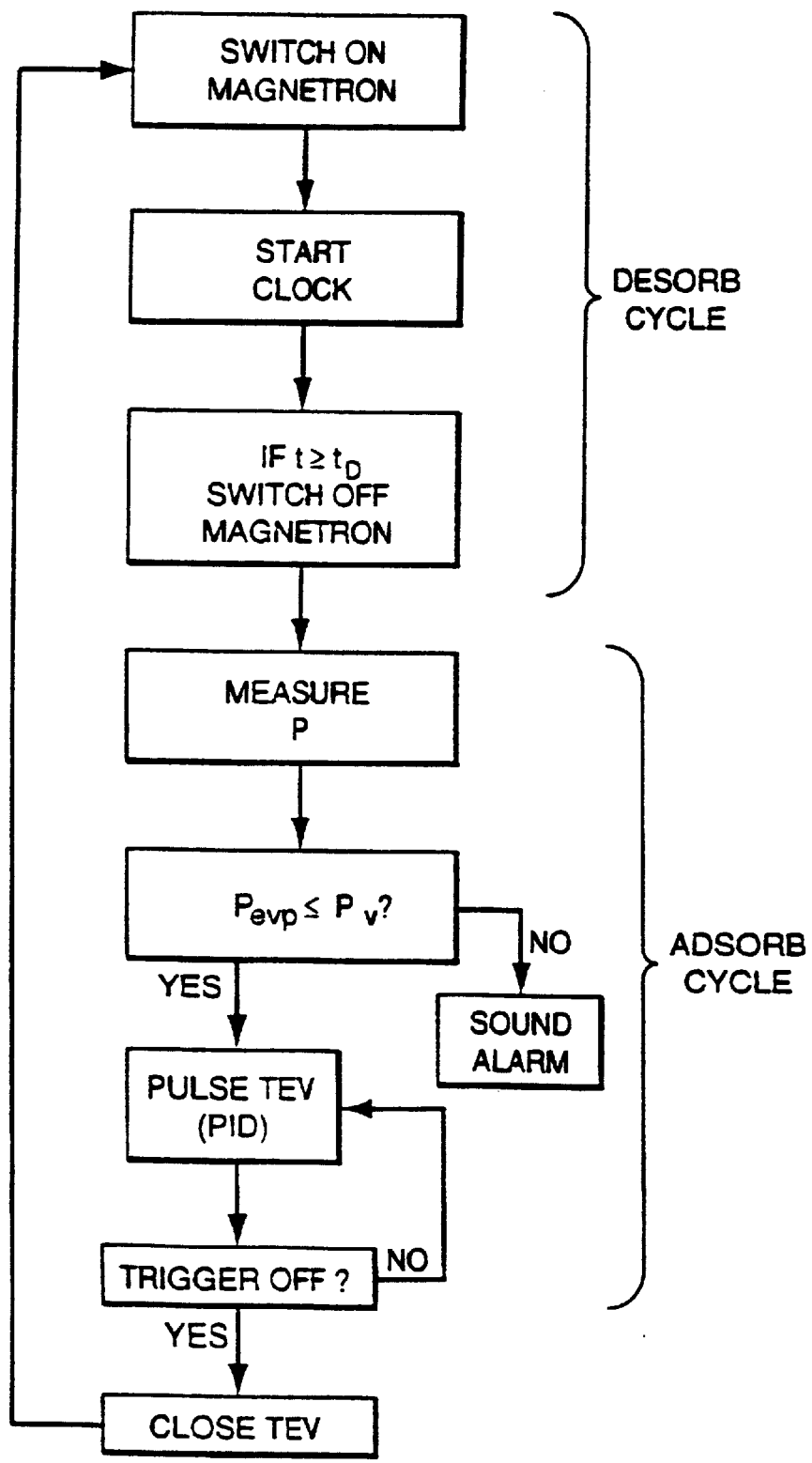
FIG. 2, is a flow diagram of the process control steps of the sorption system depicted in FIG. 1.

In the preferred embodiment, the microcontroller 26 controls the operation of the sorption system and, consequently, the execution of the desorb and adsorb cycles, in response to preprogrammed process control software stored in the associated memory device. Referring to FIG. 2, the desorb cycle begins when the microcontroller 26 sends a signal to switch 22 to activate magnetron 16. Simultaneously, the microcontroller begins to track time, or count pulses, from its clock 28. Once the time reaches the predetermined desorb cycle time, the derivation of which will be described hereafter by way of example, the magnetron sends a signal to switch 22 to deactivate the magnetron 16.

Alternatively, the end of the desorb cycle can be determined by sensing the temperature of the magnetron 16. In this embodiment, which is illustrated in FIG. 1A, the present sorption system includes a suitable temperature sensor 56 which is positioned adjacent the cathode 30 and communicates with the microcontroller 26 via a lead 58. As the sorbate is desorbed from the sorbate/sorbent compound, the characteristic impedance of the waveguide applicator will change. Consequently, a percentage of the power will not be transmitted to the waveguide applicator 10, and this will cause the cathode 30 to heat up. Once the temperature of the cathode 30 increases by a predetermined amount, for example 15° C., the microcontroller 26 deactivates the magnetron, 16 to end the desorb cycle. The specific temperature rise will depend on the given system and magnetron employed and may be determined empirically.

After the desorb cycle has been completed, the microcontroller senses the evaporator pressure ($P_{evp}$) and compares this to the vapor pressure of the sorbate at the desired evaporator temperature ($P_v$). If $P_{evp}$ is less than or equal to $P_v$, then the microcontroller 26 pulses the TEV 48 to release the sorbate into the evaporator 42 and thereby begin the adsorb cycle. The pulse width and initial cycle of the TEV 42 are determined empirically for a given system, the objective being to ensure that all of the sorbate evaporates and a superheat of around 3° to 5° C. is maintained so that the sorbate remains in the gas state when it leaves the evaporator 42. The microcontroller 26 then optimally executes a proportional integral derivative (PID) control routine to modulate the frequency of the pulse cycle. If, however, $P_{evp}$ is greater than $P_v$, which may indicate for example that the TEV 48 is stuck open and the evaporator is flooded, an alarm will preferably sound so that the malfunction can be addressed.

During the PID routine, the microcontroller samples $P_{evp}$ at a rate at least twice the pulse frequency and modulates the pulse frequency depending on the measured changes in $P_{evp}$ to maintain $P_{evp}$ less than or equal to $P_v$. Alternatively, the microcontroller may modulate the pulse width to achieve the same effect. The PID routine requires several input variables, including the phase margin, the phase margin frequency, the percent overshoot and the peak time. These input variables are determined by measuring the response of the system, for example the pressure at the pressure sensor 50 to known inputs. The implementation of the PID control routine in software and the derivation of the input variables is achieved using known techniques. As an alternative to the PID control routine, the microcontroller 26 may pulse the TEV 48 in accordance with any suitable fuzzy logic or heuristic control routine to achieve the results described above.

The process control software preferably includes a software trigger to determine the end of the adsorb cycle. In one embodiment, the microcontroller may simply compare the elapsed time from the clock 28 with the total cycle time. If the elapsed time is equal to the predetermined desorb cycle time plus the predetermined adsorb cycle time, the derivation of which will be described hereafter by way of example, the microcontroller will close the TEV 42 and begin another desorb cycle. Alternatively, if the microcontroller 26 determines that $P_{evp}$ is not equal to $P_v$ within two settling times of the system, which condition indicates that the evaporator may have become flooded, then the microcontroller 26 will close the TEV 42 and begin another desorb cycle. Otherwise, the microcontroller 26 will continue pulsing the TEV 42 as part of the adsorb cycle. Of course, the above software triggers may both be used to provide redundancy, if desired.

After the adsorb cycle and prior to the desorb cycle, the pressure within the sorber 12 is relatively low. Consequently, a possibility exists that a plasma ignition may occur in the sorber 12 as a result of the Geissler effect once the magnetron 16 is activated to begin the desorb cycle. A plasma ignition may destroy the sorbent and reduce the performance of the sorption system. In order to prevent the occurrence of a plasma ignition, the present system contemplates increasing the pressure in the sorber 12 prior to or at the onset of the desorption reaction. Accordingly, the microcontroller 26 may be programmed to pulse the TEV 48 briefly, for example three times, prior to actuating the magnetron 16 in order to bring the pressure within the sorber 12 to a level sufficient to avoid the Geissler effect. Alternatively, with reference to FIG. 1A, the power circuit 18 of the sorption system may include a power mosfet 60 to control the current of the cathode 30. Mosfet 60 is controlled by the microcontroller 26 to gradually increase the current in the magnetron 16 to initiate desorption and thereby gradually increase the pressure in the sorber 16 before the full power of the magnetron 16 is transmitted to the sorber 12.

The requirements of the exemplary refrigeration sorption system determine the types and amounts of the sorbate and sorbent to be used. If the cooling requirements, in terms of cooling capacity or rate, are greater than the capacity of the magnetron, then a single waveguide applicator 10 may be used in a batch cooling system. It is apparent that various modifications may be made in the present methods without departing from the inventive concepts herein, as defined in the claims.

EXAMPLE

For example, assume that a 900 W magnetron is available and that the system is required to provide 3 kW of cooling to maintain an evaporator temperature of −50° C. for 30 seconds. The required evaporator temperature suggests the use of ammonia as the sorbate or refrigerant. Since as mentioned above it is desired to maintain the condenser temperature between 30° and 50° C., a sorbent must be selected that will allow the ammonia to evaporate from a liquid at 30° to 50° C. to a vapor at −50° C. Vapor pressure curves for various ammonia-sorbent compounds suggest the use of strontium bromide as the sorbent.

Once the sorbate and sorbent are selected, the mass flow rate and the amount of sorbate required to achieve the desired cooling effect may be determined. The change in enthalpy from the liquid ammonia at 50° C. to vapor ammonia at −50° C. is known to be about 1050 joules per gram. The mass flow rate (MFR) of the ammonia is then determined as follows:

MFR=cooling capacity/change in enthalpy

=(3000 J/s)/(1050 J/g)=2.86 9/s $NH_3$

Thus, 2.86 grams of ammonia will evaporate each second at an evaporator temperature of −50° C. Since it is required to maintain this temperature for 30 seconds, a total of 2.86 g/s×30 s=85.80 grams of ammonia are required in the system.

Once the amount of sorbate has been determined, the required amount of sorbent may be calculated. Since the molecular weight of ammonia is about 17.03 g/mole, 85.80 grams of ammonia is equivalent to roughly 5.04 moles. It is known that each molecule of strontium bromide can combine with eight molecules of ammonia. Therefore, assuming complete adsorption of the ammonia onto the strontium bromide, (5.04 moles $NH_3$)/(8 moles $NH_3$/mole $SrBr_2$)=0.63 mole $SrBr2$ is required. Since the molecular weight of strontium bromide is about 247.43 g/mole, the amount of strontium bromide required is thus 155.88 grams. Of course other factors, for example the time required to dissipate the heat of adsorption, may require that more sorbent be used. These factors depend upon the design of the particular sorber and waveguide applicator.

It is known that approximately 2550 joules of energy are required to desorb one gram of ammonia from strontium bromide. Therefore, to desorb 85.80 grams of ammonia requires 218,790 joules of energy. The time required to do this with a 900 W magnetron is thus 218,790 J/(900 J/s)= 243.10 s, which is roughly 4 minutes. Thus, in the example of the batch refrigeration sorption system just described, the desorb cycle will last 4 minutes and be followed by an adsorb cycle of 30 seconds. This cycle may be repeated as required.

While the present invention has been described with reference to particular embodiments, it will be understood that the embodiments are illustrative and that the invention scope is not limited to these embodiments. Many variations, modifications, additions and improvements to the embodiments described are possible. These variations, modifications, additions and improvements may fall within the scope of the invention as detailed within the following claims.

What is claimed is:

1. A method for the generation of ammonia, comprising:
   (a) providing an ammoniated metal salt having the formula $MA_n \cdot X(NH_3)$; wherein:

M is at least one metal selected from the group consisting of alkali metals, alkaline earth metals, scandium, ytterbium, the lanthanides, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, mercury, tin, and aluminum;

A is at least one ion selected from the group consisting of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$;

n is from 1 to 6; and

X is from 1 to 8; and (b) applying microwave energy to said salt for a time sufficient to produce said ammonia, wherein applying microwave energy does not substantially increase a temperature of said salt.

2. The method of claim 1 wherein:
   M is at least one of copper, silver, and gold;
   A is at least one $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and
   n is 1.

3. The method of claim 1 wherein:
   M is at least one of chromium, manganese, iron, cobalt, nickel, palladium, platinum, copper, zinc, cadmium, and mercury;
   A is at least $Cl^-$, $Br^-$, $F^-$, $I^-$, $ClO_3^-$, $ClO_4^-$, $BF_4$, $AlCl_4^-$, $PF_6^-$, $SbCl_6^-$, and $SbF_6^-$; and n is 2.

4. The method of claim 1 wherein:
   M is at least one of scandium, ytterbium, the lanthanides, chromium, molybdenum, tungsten, technetium, rhenium, iron, ruthenium, osmium, cobalt, rhodium, and iridium;
   A is at least one of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and
   n is 3.

5. The method of claim 1 wherein:
   M is at least one of titanium, zirconium, hafnium, vanadium, niobium, molybdenum, tungsten, and osmium;
   A is at least one of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and
   n is 4.

6. The method of claim 1 wherein:
   M is at least one of niobium, tantalum, tungsten, and molybdenum;
   A is at least one of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and
   n is 5.

7. The method of claim 1 wherein:
   M is tungsten;
   A is at least one of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and
   n is 6.

8. The method of claim 1 wherein M is at least one of alkaline earth metals, chromium, manganese, iron, cobalt, nickel, cadmium, zinc, tantalum, rhenium, sodium, potassium, cesium, aluminum, and copper, and A is $Cl^-$ or $Br^-$.

9. The method of claim 1 wherein M is at least one of chromium, manganese, iron, cobalt, nickel, cadmium, zinc, tantalum or rhenium, and A is $Cl^-$ or $Br^-$.

10. The method of claim 1 wherein $MA_n$ is one of $NaAlCl_4$, $KAlCl_4$, $K_2ZnCl_4$, $K_2FeCl_5$, or $CsCuCl_3$.

11. The method of claim 1 wherein M is an alkali metal or an alkaline earth metal, A is $Cl^-$ or $Br^-$, and n is 1 or 2.

12. A method of claim 1 where said ammoniated metal salt is a chloride or bromide of strontium.

13. A method for cooling, comprising:
    (a) adsorbing ammonia onto a metal salt to provide a corresponding ammoniated metal salt;
    (b) desorbing ammonia from said anmoniated metal salt by applying microwave energy thereto, wherein applying microwave energy does not substantially increase a temperature of said ammoniated metal salt; and
    (c) circulating said desorbed ammonia through a refrigeration sorption system to produce said cooling.

14. The method of claim 13 wherein Step (a) comprises, (i) subjecting said metal salt to microwave energy to remove water and then (ii) exposing said metal salt to ammonia.

15. The method of claim 13, wherein said application of microwave energy is for a time sufficient to desorb said ammonia.

16. The method of claim 13 wherein said ammoniated metal salt has the formula $MA_n \cdot X(NH_3)$, wherein:
    M is at least one metal selected from the group consisting of alkali metals, alkaline earth metals, scandium, ytterbium, the lanthanides, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, mercury, tin, and aluminum;

A is at least one ion selected from the group consisting of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$;

n is from 1 to 6; and

X is from 1 to 8.

17. The method of claim 16 wherein:

M is at least one of copper, silver, and gold;

A is at least one $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and n is 1.

18. The method of claim 16 wherein:

M is at least one of chromium, manganese, iron, cobalt, nickel, palladium, platinum, copper, zinc, cadmium, and mercury;

A is at least one of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and n is 2.

19. The method of claim 16 wherein:

M is at least one of scandium, ytterbium, the lanthanides, chromium, molybdenum, tungsten, technetium, rhenium, iron, ruthenium, osmium, cobalt, rhodium, and iridium;

A is at least one $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and n is 3.

20. The method of claim 16 wherein:

M is at least one of titanium, zirconium, hafnium, vanadium, niobium, molybdenum, tungsten, and osmium;

A is at least one ion of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and n is 4.

21. The method of claim 16 wherein:

M is at least one of niobium, tantalum, tungsten, and molybdenum;

A is at least one of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and n is 5.

22. The method of claim 16 wherein:

M is tungsten;

A is at least one of $Cl^-$, $Br^-$, $F^-$, $I^-$, $ClO_3^-$, $ClO_4^-$, $BF_4^-$, $AlCl_4^-$, $PF_6^-$, $SbCl_6^-$, and $SbF_6^-$; and n is 6.

23. The method of claim 16 wherein M is at least one of alkaline earth metals, chromium, manganese, iron, cobalt, nickel, cadmium, zinc, tantalum, rhenium, sodium, potassium, cesium, aluminum, and copper, and A is $Cl^-$ or $Br^-$.

24. The method of claim 16 wherein M is at least one of chromium, manganese, iron, cobalt, nickel, cadmium, zinc, tantalum or rhenium, and A is $Cl^-$ or $Br^-$.

25. The method of claim 16 wherein $MA_n$ is one of $NaAlCl_4$, $KalCl_4$, $K_2ZnCl_4$, $K_2FeCl_5$, or $CsCuCl_3$.

26. The method of claim 16 wherein M is a alkali metal or an alkaline earth metal, A is $Cl^-$ or $Br^-$, and n is 1 or 2.

27. A method of claim 16 where said ammoniated metal salt is a chloride or bromide of strontium.

28. A method for cooling, comprising:

(a) a desorbing ammonia onto a zeolite to provide a corresponding ammoniated zeolite;

(b) desorbing ammonia from said ammoniated zeolite by applying microwave energy thereto for a time sufficient to produce said ammonia, wherein applying microwave energy does not substantially increase a temperature of said ammoniated zeolite; and (c) circulating said desorbed ammonia through a refrigeration sorption system to produce said cooling.

29. A method for the generation of phosphine or arsine, comprising:

(a) providing a ligated metal salt having the formula $MA_n \cdot X(EH_3)$; wherein:

M is at least one metal selected from the group consisting of alkali metals, alkaline earth metals, scandium, ytterbium, the lanthanides, titanium, zirconium, hafnium, vanadium, niobium, tantalum, chromium, molybdenum, tungsten, manganese, technetium, rhenium, iron, ruthenium, osmium, cobalt, rhodium, iridium, nickel, palladium, platinum, copper, silver, gold, zinc, cadmium, mercury, tin, and aluminum;

A is at least one ion selected from the group consisting $Cl^-$, $Br^-$, $F^-$, $I^-$, $ClO_3^-$, $ClO_4^-$, $BF_4^-$, $AlCl_4^-$, $PF_6^-$, $SbCl6^-$, and $SbF_6^-$;

n is from 1 to 6;

X is from 1 to 8; and

E is P or As; and (b) applying microwave energy to said salt for a time sufficient to produce said phosphine or arsine, wherein applying microwave energy does not substantially increase a temperature of said salt.

30. The method of claim 29 wherein E is P.

31. The method of claim 29 wherein E is As.

32. The method of claim 1 wherein said ammoniated metal salt of step (A) further comprises ammonium.

33. The method of claim 1 where said ammoniated metal salt of step (A) is partially ammoniated.

* * * * *

UNITED STATES PATENT AND TRADEMARK OFFICE
CERTIFICATE OF CORRECTION

PATENT NO. : 6,244,056 B1
DATED : June 12, 2001
INVENTOR(S) : Dennis M. Pfister and Charles M. Byrd It is certified that error appears in the above-identified patent and that said Letters Patent is hereby corrected as shown below:

Column 12, claim 13,
Line 45, please delete "anmoniated" and substitute "ammoniated".

Column 14, claim 28,
Line 11, please delete "a desorbing" and substitute "adsorbing".

Column 14, claim 29,
Line 35, please delete "SbC16$^-$" and substitute "SbCl$_6^-$".

Signed and Sealed this

Sixteenth Day of April, 2002

Attest:

JAMES E. ROGAN
*Director of the United States Patent and Trademark Office*

*Attesting Officer*